US008043432B2

(12) United States Patent
Dip (10) Patent No.: US 8,043,432 B2
(45) Date of Patent: Oct. 25, 2011

(54) ATOMIC LAYER DEPOSITION SYSTEMS AND METHODS

(75) Inventor: Anthony Dip, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 126 days.

(21) Appl. No.: 11/673,852

(22) Filed: Feb. 12, 2007

(65) Prior Publication Data
US 2008/0193643 A1 Aug. 14, 2008

(51) Int. Cl.
*C23C 16/00* (2006.01)
*H01L 21/306* (2006.01)

(52) U.S. Cl. .................................. 118/719; 427/255.5

(58) Field of Classification Search ............... 118/719
See application file for complete search history.

(56) References Cited

U.S. PATENT DOCUMENTS

| | | | |
|---|---|---|---|
| 3,696,779 A * | 10/1972 | Murai et al. ............... | 118/725 |
| 4,058,430 A | 11/1977 | Suntola et al. | |
| 4,389,973 A | 6/1983 | Suntola et al. | |
| 4,413,022 A | 11/1983 | Suntola et al. | |
| 4,976,996 A | 12/1990 | Monkowski et al. | |
| 4,994,301 A * | 2/1991 | Kusumoto et al. ............ | 427/586 |
| 5,482,557 A | 1/1996 | Kanai et al. | |
| 5,522,934 A * | 6/1996 | Suzuki et al. .......... | 118/723 AN |
| 5,730,802 A | 3/1998 | Ishizumi et al. | |
| 5,807,792 A * | 9/1998 | Ilg et al. ........................ | 438/758 |
| 5,851,294 A * | 12/1998 | Young et al. ................ | 118/715 |
| 5,879,459 A | 3/1999 | Gadgil et al. | |
| 6,174,377 B1 | 1/2001 | Doering et al. | |
| 6,342,277 B1 | 1/2002 | Sherman | |
| 6,387,185 B2 | 5/2002 | Doering et al. | |
| 6,428,859 B1 | 8/2002 | Chiang et al. | |
| 6,511,539 B1 | 1/2003 | Raaijmakers | |
| 6,569,501 B2 | 5/2003 | Chiang et al. | |
| 6,576,062 B2 | 6/2003 | Matsuse | |
| 6,579,374 B2 | 6/2003 | Bondestam et al. | |
| 6,630,201 B2 | 10/2003 | Chiang et al. | |
| 6,769,629 B2 | 8/2004 | Hwang et al. | |
| 6,812,157 B1 | 11/2004 | Gadgil | |
| 6,818,067 B2 | 11/2004 | Doering et al. | |
| 6,872,421 B2 | 3/2005 | Hwang et al. | |

(Continued)

FOREIGN PATENT DOCUMENTS

DE 10141084 A1 * 11/2002

(Continued)

OTHER PUBLICATIONS

European Patent Office, International Search Report issued in corresponding PCT Application serial No. PCT/US2008/053561 dated Sep. 22, 2008.

(Continued)

*Primary Examiner* — Karla Moore
(74) *Attorney, Agent, or Firm* — Wood, Herron & Evans, LLP (57) ABSTRACT

Systems and methods for depositing thin films using Atomic Layer Deposition (ALD). The deposition system includes a process chamber with a peripheral sidewall, partitions that divide a processing space inside the process chamber into at least first and second compartments, and a platter that supports substrates within the processing space. The platter rotates the substrates relative to the stationary peripheral sidewall and compartments. The first compartment receives a process material used to deposit a layer on each of the substrates. An injector, which injects the process material, communicates with the first compartment through the peripheral sidewall.

23 Claims, 9 Drawing Sheets

U.S. PATENT DOCUMENTS

| | | | |
|---|---|---|---|
| 6,878,402 | B2 | 4/2005 | Chiang et al. |
| 6,902,620 | B1 | 6/2005 | Omstead et al. |
| 6,902,624 | B2 | 6/2005 | Seidel et al. |
| 6,972,055 | B2 * | 12/2005 | Sferlazzo .................. 118/719 |
| 7,153,542 | B2 * | 12/2006 | Nguyen et al. ............ 427/248.1 |
| 7,303,141 | B2 * | 12/2007 | Han et al. ...................... 239/1 |
| 2004/0187784 | A1 | 9/2004 | Sferlazzo |
| 2005/0084610 | A1 | 4/2005 | Selitser |

FOREIGN PATENT DOCUMENTS

WO  2006065014 A1  6/2006

OTHER PUBLICATIONS

Bedair, S.M. et al., "Atomic Layer Epitaxy of III-V Binary Compounds", Appl. Phys. Lett. 47 (1), Jul. 1, 1985, pp. 51-53.

Dip, Anthony et al., "Atomic Layer Epitaxy of GaAs With a 2 μm/h Growth Rate", Appl. Phys. Lett. 62 (19), May 10, 1993, pp. 2378-2380.

Colter, P.C. et al., "Atomic Layer Epitaxy of Device Quality GaAs with a 0.6 μm/h Growth Rate", Appl. Phys. Lett. 59 (12), Sep. 16, 1991, pp. 1440-1442.

Liu, H. et al., "GaAs Atomic Layer Epitaxy in a Rotating Disc Reactor", SPIE vol. 1676 (1992) pp. 20-25.

Reid, K.G. et al., "Role of Trimethylgallium Exposure Time in Carbon Doping and High Temperature Atomic Layer Epitaxy of GaAs", Appl. Phys. Lett. 59 (19), Nov. 4, 1991, pp. 2397-2399.

State Intellectual Property Office of the People's Republic of China, Office Action issued in related Chinese Patent Application No. 200880004827.2 dated Feb. 17, 2011.

* cited by examiner

ATOMIC LAYER DEPOSITION SYSTEMS AND METHODS

FIELD OF THE INVENTION

This invention relates to systems and methods for depositing thin films using Atomic Layer Deposition (ALD).

BACKGROUND OF THE INVENTION

As dimensions for microelectronics are reduced and the demand for such materials increase, thin semiconductor films having uniform composition and uniform thickness over a larger substrate area are increasingly desirable. A common process used for depositing thin films on a substrate is Chemical Vapor Deposition (CVD), which provides for deposition of relatively uniform films over complex device topography. In a typical CVD process, the substrate is exposed to two or more volatile precursors, which react and/or decompose on the substrate surface to produce the desired thin film.

Despite improvements of CVD over previous deposition techniques, CVD has several disadvantages. For example, because CVD is flux-dependent, deposition conditions such as substrate temperature, pressure, and gas flow rate must be accurately and consistently maintained to produce a desired thin film of uniform thickness. Additionally, CVD tends to incorporate undesired reaction products into the deposited thin film, thereby diminishing the purity of the thin film.

Atomic Layer Deposition (ALD), which represents a variant of CVD, is a contemporary technology for depositing thin films now emerging as a potentially superior method of achieving highly uniform, conformal film deposition. ALD is a process wherein conventional CVD processes are divided into separate deposition steps to construct the thin film by sequentially depositing single atomic monolayers in each deposition step. The technique of ALD is based on the principle of the formation of a saturated monolayer of reactive precursor molecules by chemisorption. A typical ALD process consists of injecting a first precursor for a period of time until a saturated monolayer is formed on the substrate. Then, the first precursor is purged from the chamber using an inert gas. This is followed by injecting a second precursor into the chamber, also for a period of time, thus forming a layer on the wafer from the reaction of the second precursor with the first precursor. Then, the second precursor is purged from the chamber. This process of introducing the first precursor, purging the process chamber, introducing the second precursor, and purging the process chamber is repeated a number of times to achieve a layer of a desired thickness.

ALD thin films may be deposited using single wafer reactors with the reactive gas precursors injected into the process chamber horizontally. The horizontal gas precursor injection directs the gas precursors in a direction parallel to the surface of a stationary substrate. Arrangements in which the reactive gas precursors flow in a direction parallel to the substrate surface are desirable because they result in more uniform thin films than those deposited by gas precursors injected vertically in a direction perpendicular to the substrate surface. Nevertheless, a major disadvantage of a single wafer reactor is that it has a significantly diminished commercial value because of its relatively low throughput. Another disadvantage is that the process chamber must be purged before each individual gas precursor is introduced.

At least in part to overcome the commercial problems associated with single wafer reactors, multi-wafer reactors may be used for ALD processes in which the process chamber is partitioned into a plurality of process compartments. The substrates are rotated relative to the process compartments such that each substrate is sequentially transferred from one compartment to another. In each individual process compartment, each substrate is exposed to either a precursor gas or an inert gas. The rotating substrates are sequentially exposed to the different precursor gases and the inert gas. One characteristic disadvantage of these multi-wafer reactors is that multi-wafer reactors employ showerhead injectors that inject the precursor gases in an axially symmetric direction generally perpendicular to the substrate surface. As a result, although faster process times are achieved, multi-wafer ALD process chambers may produce thin films with reduced thickness uniformity.

Therefore, there is a need for a multi-wafer process chamber in which the reactive gas precursors are injected into each process compartment in a direction parallel to the top surface of the substrates.

SUMMARY OF THE INVENTION

One embodiment of the invention provides a deposition system for processing a plurality of substrates. The deposition system comprises a process chamber including a first wall, a second wall spaced apart from the first wall, and a peripheral sidewall connecting the first and second walls to define a processing space. A substrate support is configured to support the substrates between the first and second walls and radially inside the peripheral sidewall. The substrate support is configured to rotate the substrates relative to the peripheral sidewall in a closed path about an axis of rotation. A plurality of partitions extend relative to the axis of rotation toward the peripheral sidewall. The partitions divide the processing space into a plurality of compartments including a first compartment and a second compartment containing an inert atmosphere. A first material injector communicates through the peripheral sidewall with the first compartment and is configured to inject a first process material into the first compartment. A top surface of each of the substrates, during each complete rotation about the axis of rotation, is sequentially exposed to the first process material in the first compartment and the inert atmosphere in the second compartment.

Another embodiment of the invention provides a method for depositing a layer on each of a plurality of substrates. The method comprises arranging the substrates with a spaced circumferential relationship about an axis of rotation and rotating the substrates in a closed path about the axis of rotation. The method further comprises injecting a first process material in a radial direction relative to the axis of rotation and into a first compartment defined by partitions bounding a first included angle about the axis of rotation. During each complete rotation, a top surface of each of the substrates is exposed to the first process material within the first compartment to bond molecules of the first process material and, moreover, to an inert atmosphere within a second compartment defined by partitions bounding a second included angle about the axis of rotation.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

Figure 1:
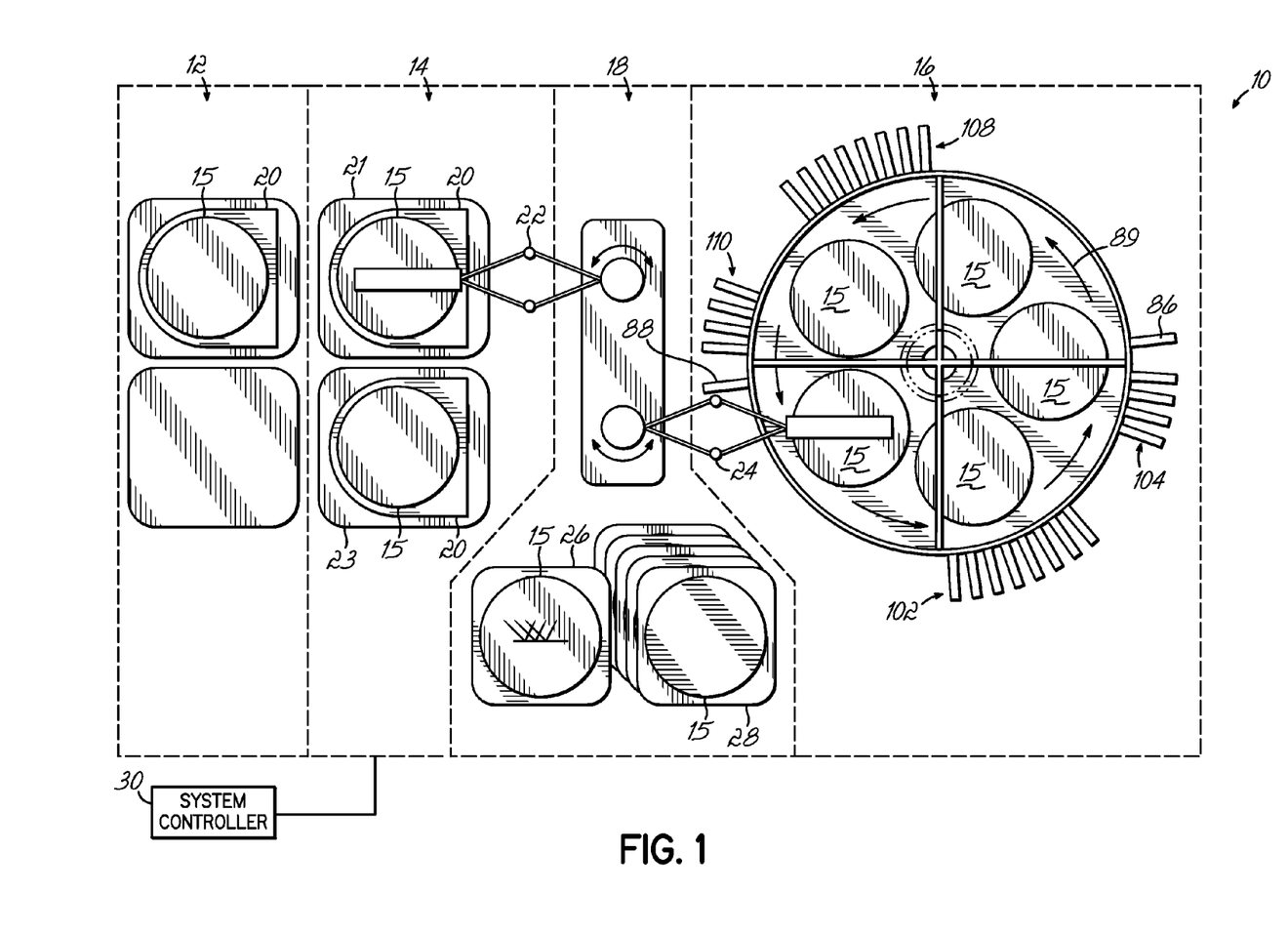
FIG. 1 is a diagrammatic top plan view of a deposition system including a process chamber in accordance with an embodiment of the invention.

With reference to FIG. 1, a deposition system 10 for processing a plurality of substrates 15 comprises an input/output station 12, a load/lock station 14, a process chamber 16, and a transfer chamber 18 interposed between the load/lock station 14 and process chamber 16. The deposition system 10, which is shown in a simplified manner, may include additional structures, such as additional vacuum-isolation walls coupling the load/lock station 14 with the transfer chamber 18 and the process chamber 16 with the transfer chamber 18, as understood by a person having ordinary skill in the art. The input/output station 12, which is at or near atmospheric pressure (e.g., 760 Torr), is adapted to receive wafer cassettes 20, such as front opening unified pods (FOUPs). The wafer cassettes 20 are sized and shaped to hold a plurality of substrates 15, such as semiconductor wafers having diameters of, for example, 200 or 300 millimeters.

The load/lock station 14 is adapted to be evacuated from atmospheric pressure to a vacuum pressure and to be vented from vacuum pressure to atmospheric pressure, while the process chamber 16 and transfer chamber 18 are isolated and maintained continuously under vacuum pressures. The load/lock station 14 holds a plurality of the wafer cassettes 20 introduced from the atmospheric pressure environment of the input/output station 12. The load/lock station 14 includes platforms 21, 23 that each support one of the wafer cassettes 20 and that can be vertically indexed to promote wafer transfers to and from the process chamber 16.

A wafer transfer mechanism 22 transfers substrates 15 under vacuum from one of the wafer cassettes 20 in the load/lock station 14 through the transfer chamber 18 and into the process chamber 16. Another wafer transfer mechanism 24 transfers substrates 15 processed in the process chamber 16 under vacuum from the process chamber 16 through the transfer chamber 18 and to the wafer cassette 20. The wafer transfer mechanisms 22, 24, which operate independently of each other for enhancing the throughput of the deposition system 10, may be selective compliant articulated/assembly robot arm (SCARA) robots commonly used for pick-and-place operations. The wafer transfer mechanisms 22, 24 include end effectors configured to secure the substrates 15 during transfers. The process chamber 16 may include distinct first and second sealable ports (not shown) used by wafer transfer mechanisms 22, 24, respectively, to access the processing space 38 (FIGS. 3A, 3B) inside the process chamber 16. The access ports are sealed when a deposition process is occurring in the process chamber 16. Wafer transfer mechanism 22 is depicted in FIG. 1 as transferring unprocessed substrates 15 from wafer cassette 20 on platform 21 of the load/lock station 14 to the process chamber 16. Wafer transfer mechanism 24 is depicted in FIG. 1 as transferring processed substrates 15 from the process chamber 16 to wafer cassette 20 on platform 23 of the load/lock station 14.

The wafer transfer mechanism 24 may also transfer processed substrates 15 extracted from the process chamber 16 to a metrology station 26 for examination or to a cool down station 28 used for post-processing low pressure cooling of the substrates 15. The processes performed in the metrology station 26 may include, but are not limited to, conventional techniques used to measure film thickness and/or film composition, such as ellipsometry, and particle measurement techniques for contamination control.

The deposition system 10 is equipped with a system controller 30 programmed to control and orchestrate the operation of the deposition system 10. The system controller 30 typically includes a central processing unit (CPU) for controlling various system functions, chamber processes and support hardware (e.g., detectors, robots, motors, gas sources hardware, etc.) and monitoring the system and chamber processes (e.g., chamber temperature, process sequence throughput, chamber process time, input/output signals, etc.). Software instructions and data can be coded and stored within the memory for instructing the CPU. A software program executable by the system controller 30 determines which tasks are executed on substrates 15 including tasks relating to monitoring and execution of the processing sequence tasks and various chamber process recipe steps.

With continued reference to FIGS. 2, 2A, 3A, and 3B, the process chamber 16 includes a first wall 32, a second wall 34, and a peripheral sidewall 36 that extends between and connects the first and second walls 32, 34 to define the boundaries of a processing space 38. The second wall 34 is spaced apart from the first side wall 32 by the height or vertical dimension, d, of the peripheral sidewall 36 and is oriented generally parallel to the first wall 32. The peripheral sidewall 36 extends circumferentially about an azimuthal axis 40 of symmetry. The diameter of the peripheral sidewall 36 is significantly larger than the vertical dimension, d, so that the process chamber 16 has a flat "pancake" geometrical shape.

A fore line 42, which has the form of a duct or tubular conduit bent at a right angle, is coupled with a port 44 extending through the first wall 32 of the process chamber 16. The fore line 42 couples the processing space 38 in fluid communication with a vacuum system 46, which consists of conventional vacuum pumps of a type used to evacuate gases from an enclosed volume like processing space 38. Although the fore line 42 is depicted as angled with a right angle bend, a person having ordinary skill in the art would appreciate that the fore line 42 may have any desired angular bend or may be straight with no bend at all. The latter configuration is believed to optimize the pumping conductance.

A susceptor having the form of a substrate support 48 is disposed inside the process chamber 16. The substrate support 48 includes a disk-shaped platter 50 and a plurality of circular pockets or recesses 52 defined in a top surface 49 of the platter 50. The top surface 49 of the platter 50 faces toward first wall 32 so that the recesses 52 open toward the first wall 32.

Each of the recesses 52 is configured to hold at least one of the substrates 15 at a location radially within the peripheral sidewall 36 of the process chamber 16. The number of individual recesses 52 may range, for example, from 2 to 7.

However, a person having ordinary skill in the art would appreciate that the substrate support 48 may be configured with any desired number of recesses 52 depending on the dimensions of the substrates 15 and the dimensions of the substrate support 48. For example, configuring the platter 50 with between 3 and 6 recesses 52 shaped to receive round substrates 15 may optimize the usable fraction of the surface area of top surface 49. Additionally, although this embodiment of the invention is depicted as having recesses 52 of a circular or round geometrical shape, one of ordinary skill in the art would appreciate that the recesses 52 may be of any desired shape to accommodate an appropriately shaped substrate.

The deposition system 10 may be configured to process 200 mm substrates, 300 mm substrates, or larger-sized round substrates, which dimensioning will be reflected in the dimensions of recesses 52. In fact, it is contemplated that the deposition system 10 may be configured to process substrates, wafers, or liquid crystal displays regardless of their size, as would be appreciated by those skilled in the art. Therefore, while aspects of the invention will be described in connection with the processing of substrates 15 that are semiconductor substrates, the invention is not so limited.

The recesses 52 are distributed circumferentially on the platter 50 about a uniform radius centered on an axis of rotation 54. The recesses 52 have approximately equiangular spacing about the axis of rotation 54, which is substantially collinear or coaxial with the azimuthal axis 40 although the invention is not so limited. As best shown in FIG. 2A, adjacent recesses 52 may be separated by a gap distance equal to $s-2 w_r$, wherein s is the distance between the centers of the adjacent recesses 52, and $w_r$ is the radius of the adjacent recesses 52. The fore line 42, which provides for evacuation of the atmosphere of the processing space 38, is disposed along the axis of rotation 54 and above the platter 50.

With continued reference to FIGS. 2, 2A, 3A, and 3B, the platter 50 of the substrate support 48 is coupled with a drive motor 56, which is disposed outside of the process chamber 16, by a drive shaft 58. The drive shaft 58, which extends along the axis of rotation 54, is disposed in a tubular extension 35 of the second wall 34. A rotary vacuum feedthrough 60 couples the drive shaft 58 with the drive motor 56. The rotary vacuum feedthrough 60 is configured to transmit rotary motion from the drive motor 56 through the second wall 34 to the drive shaft 58 for rotating the platter 50 about the axis of rotation 54.

A controller 62, which is electrically coupled to the drive motor 56, operates the drive motor 56 to rotate the platter 50 and drive shaft 58 about the axis of rotation 54. When the substrates 15 are processed in the process chamber 16, the rotation of the platter 50 may be continuous and may occur at a constant angular velocity about the axis of rotation 54. Alternatively, the angular velocity may be varied contingent upon the angular orientation of the platter 50 relative to an arbitrary reference point.

The portion of the processing space 38 between the platter 50 and the second wall 34 includes a pedestal 64 and a heater 66. The heater 66 is coupled to the pedestal 64 such that the heater 66 is at an intermediate location between a bottom surface 51 of the platter 50 and an upper surface 65 of the pedestal 64. When powered, the heater 66 transfers heat energy to the platter 50 for heating the substrates 15 held within the plurality of recesses 52 to a desired processing temperature.

Partitions 68, 70, 72, 74 compartmentalize the processing space 38 of process chamber 16 into a plurality of compartments 76, 78, 80, 82. The partitions 68, 70, 72, 74 extend radially relative to the axis of rotation 54 toward the peripheral sidewall 36. The partitions 68, 70, 72, 74 project upwardly from the top surface 49 of platter 50 towards the first wall 32. Each of the partitions 68, 70, 72, 74 has a height or vertical dimension, $d_1$, approximately equal to the vertical dimension, $d_2$, between the top surface 49 of platter 50 and the confronting surface of the first wall 32. Partition 68 extends between a first end 68a near the peripheral sidewall 36 and a second end 68b proximate to the axis of rotation 54. Partitions 70, 72, 74 have similar first and second ends 70a,b, 72a,b, and 74a,b, respectively.

The respective ends 68b, 70b, 72b, 74b of partitions 68, 70, 72, 74 intersect inside the fore line 42 at the axis of rotation 54, which may further reduce gas exchange among the four compartments 76, 78, 80, 82. The intersecting ends 68b, 70b, 72b, 74b project upwardly such that the vertical dimension, $d_3$, of the partitions 68, 70, 72, 74 is greater within the fore line 42 than the vertical dimension, $d_1$, outside of the fore line 42. However, the invention is not so limited as the partitions 68, 70, 72, 74 may have a uniform vertical dimension, $d_1$, along their entire lengths.

Compartment 76 is defined as a portion of the processing space 38 bounded between the first partition 68, the second partition 70, the first wall 32, the second wall 34, and the peripheral sidewall 36. Compartment 78 is defined as a portion of the processing space 38 bounded between the second partition 70, the third partition 72, the first wall 32, the second wall 34, and the peripheral sidewall 36. Compartment 80 is defined as a portion of the processing space 38 bounded between the third partition 72, the fourth partition 74, the first wall 32, the second wall 34, and the peripheral sidewall 36. Compartment 82 is defined as a portion of the processing space 38 bounded between the first partition 68, the fourth partition 74, the first wall 32, the second wall 34, and the peripheral sidewall 36. Although four partitions 68, 70, 72, 74 are representatively shown, a person having ordinary skill in the art would appreciate that the process chamber 16 may be subdivided with any suitable plurality of partitions to form more or less than four compartments.

With continued reference to FIGS. 2, 2A, 3A, and 3B and particularly FIG. 2A, deposition system 10 further includes a purge gas supply system 84 coupled by respective gas lines 85, 87, with inlet ports 86, 88 penetrating through the peripheral sidewall 36. Inlet port 86 and gas line 85 couple compartment 78 with the purge gas supply system 84. Inlet port 88 and gas line 87 couple compartment 82 with the purge gas supply system 84. The purge gas supply system 84 is configured to introduce a flow of a purge gas to compartments 78 and 82. The purge gas introduced into the compartments 78 and 82 can comprise an inert gas, such as a noble gas (i.e., helium, neon, argon, xenon, krypton), or nitrogen, or hydrogen. During substrate processing, purge gas is continuously introduced into the compartments 78 and 82 to provide a gaseous curtain or barrier preventing, or at the least significantly limiting, transfer of first and second process materials between compartments 76, 80. The purge gas also provides an inert atmosphere inside compartments 78, 82 so that any process material layers carried by the substrates 15 are substantially unchanged when transported on the platter 50 through compartments 78, 82. Compartment 76 is juxtaposed between compartments 78, 82 and compartment 80 is juxtaposed between compartments 78, 82 so that compartments 78, 82 separate compartments 76 and 80 to provide mutual isolation for the first and second process materials.

Deposition system 10 further includes a first process material supply system 90 configured to introduce a first process material to compartment 76, and a second process material supply system 92 configured to introduce a second process material to compartment 80. The first and second material supply systems 90, 92 may each include one or more material sources, one or more heaters, one or more pressure control devices, one or more flow control devices, one or more filters, one or more valves, or one or more flow sensors as conventionally found in such process material supply systems.

The first process material can, for example, comprise a precursor, such as a composition having the principal atomic or molecular species found in a film formed on each of the substrates 15. For example, the precursor can originate as a solid phase, a liquid phase, or a gaseous phase, and it may be delivered to compartment 76 in either a gaseous or vapor phase, and either with or without the assistance of a carrier gas. The second process material can, for example, comprises a reactant, which may also have atomic or molecular species found in the thin film formed on substrates 15. For instance, the reactant can originate as a solid phase, a liquid phase, or a gaseous phase, and it may be delivered to compartment 80 in either a gaseous or vapor phase, and either with or without the assistance of a carrier gas.

The first process material supplied by the first process material supply system 90 to process chamber 16 and the second process material supplied by the second process material supply system 92 to process chamber 16 are selected in accordance with the composition and characteristics of a material to be deposited as the thin film on the substrate. For example, the first process material can include a metal organic precursor, such as trimethylaluminum (TMA), and the second process material can include nitrogen ($N_2$) or oxygen ($O_2$). In another example, the first process material can include a precursor, such as tantalum pentachloride ($TaCl_5$), and the second process material can include a reducing agent, such as hydrogen ($H_2$) gas. The temperature and pressure of the first and second process materials are also selected to promote thin film growth.

A first set of injection ports 102 and a second set of injection ports 104 extend through the peripheral sidewall 36 to communicate with compartment 76. The injection ports 102, 104, which collectively define a material injector 100, are coupled by a first manifold 94 with the first process material supply system 90. Injection ports 102, 104 inject the first process material into the compartment 76. A third set of injection ports 108 and a fourth set of injection ports 110 extend through the peripheral sidewall 36 to communicate with compartment 80. The injection ports 108, 110, which collectively define a material injector 106, are coupled by a second manifold 96 with the second process material supply system 92. Injection ports 108, 110 inject the second process material into the compartment 80.

Figure 3A:
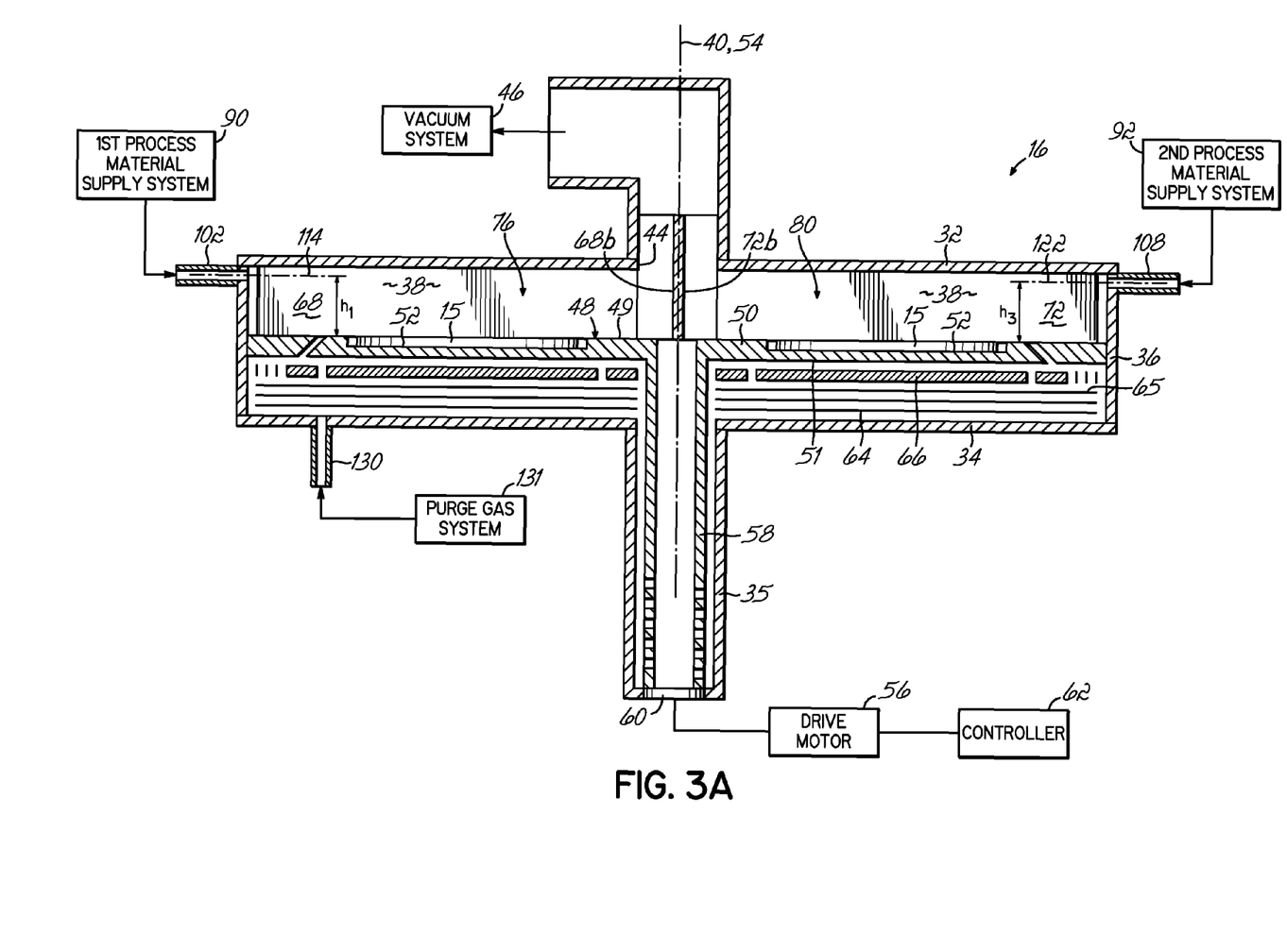
FIG. 3A is a schematic cross-sectional view taken generally along line 3A-3A in FIG. 2.

Injection ports 102 of material injector 100 are located proximate to the first partition 68. Injection ports 102 are aligned along a first angular arc 112 extending about the peripheral sidewall 36 in a first plane 114 (FIG. 3A). The first plane 114 is located above the second set of injection ports 104 and at a height, hi, above the top surface 49 of the platter 50. The first plane 114 is substantially parallel to a plane containing the top surface 49. Injection ports 104 of material injector 100 are located proximate to the second partition 70. Injection ports 104 are aligned along a second angular arc 116 extending about the peripheral sidewall 36 in a second plane 118. The second plane 118 is located at a height, $h_2$, above the top surface 49 of the platter 50 and is substantially parallel to the plane containing the top surface 49.

Figure 3B:
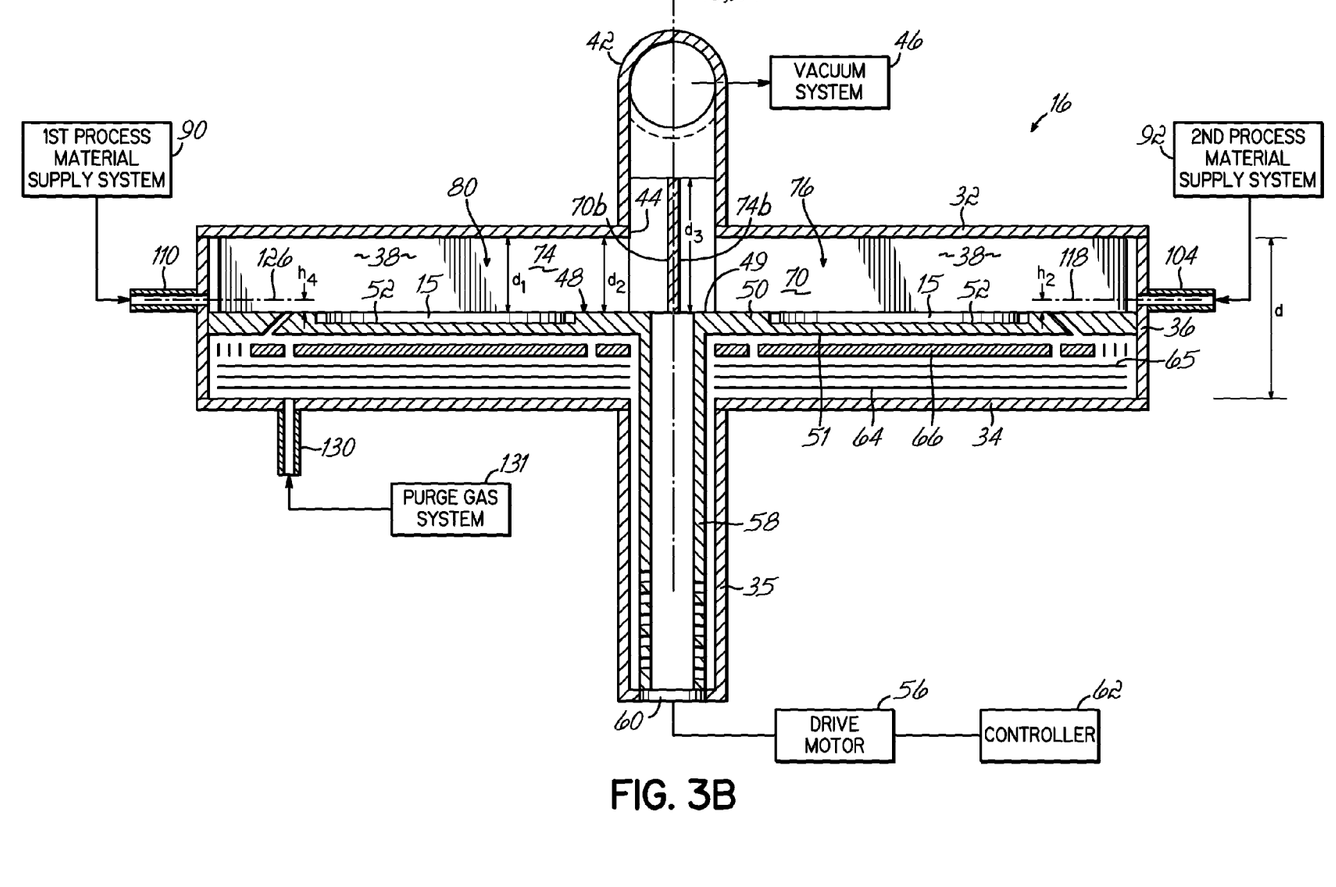
FIG. 3B is a schematic cross-sectional view taken generally along line 3B-3B in FIG. 2.

Injection ports 108 of material injector 106 are spatially positioned proximate to the third partition 72. Injection ports 108 are aligned along a third angular arc 120 extending about the peripheral sidewall 36 in a third plane 122. The third plane 122 is located above the second set of injection ports 110 and at a height, $h_3$, above the top surface 49 of the platter 50. The third plane 122 is substantially parallel to the plane containing the top surface 49. Injection ports 110 are spatially positioned proximate to the fourth partition 74. Injection ports 110 are disposed along a fourth angular arc 124 extending about the peripheral sidewall 36 in a fourth plane 126. The fourth plane 126 is at a height, $h_4$, above the top surface 49 of the platter 50 and is parallel to the plane containing the top surface 49. The angular arcs 112, 116, 120, 124 are each measured circumferentially about the peripheral sidewall 36.

In one embodiment of the invention, the first set of injection ports 102 and the third set of injection ports 108 are substantially coplanar, so that height, $h_1$, and height, $h_3$, are substantially equal, and the second set of injection ports 104 and the fourth set of injection ports 110 are substantially coplanar, so that height, $h_2$, and height, $h_4$, are substantially equal. The heights $h_1$-$h_4$ may be adjusted such that planes 114, 118, 122, 126 may have other relative arrangements, as would be appreciated by a person having ordinary skill in the art.

In one specific embodiment of the invention, the first angular arc 112 and the third angular arc 120 may each span an arc angle of about 44°. The second angular arc 116 and the fourth angular arc 124 may each span an arc angle of about 22°. A person of ordinary skill in the art would appreciate that each of the compartments 76, 78, 80, 82 may be independently equipped with any desired number of injection ports 102, 104, 108, 110, respectively, and that the respective angular arcs 112, 116, 120, 124 may each span any desired arc angle. The number of injection ports 102, 104, 108, 110 and the arc angles for the angular arcs 112, 116, 120, 124 are selected to cooperate for optimizing at least one property of the thin film being deposited on each of the substrates 15 and/or for optimizing the flow of the first and second process materials across the top surface of the substrates 15.

The material injectors 100, 106 may be configured to inject the respective first and second process materials in a substantially radial direction away from the peripheral sidewall 36 and toward the axis of rotation 54. In this configuration, process material injection from each of the material injectors 100, 106 in combination with simultaneous evacuation through the fore line 42 creates a gas flow of the respective process materials from the peripheral sidewall 36, across the substrates 15 in a direction substantially parallel to the top surface of each of the substrates 15, and towards the central location of fore line 42. As a consequence, excess process materials and deposition by-products from reactions transpiring at the top surface of the substrates 15 are removed through the fore line 42 as fresh process materials are replenished in the compartments 76, 80.

When the substrate support 48 is rotated about the axis of rotation 54, the arrangement of the recesses 52 about the circumference of the platter 50 allows each substrate 15 to be sequentially exposed to the different environment inside each of the compartments 76, 78, 80, 82. By way of example, upon rotation of the substrate support 48 through a closed path of $2\pi$ radians (360°), each of the substrates 15 is serially exposed to first process material in the environment inside the first compartment 76, then to the purge gas comprising the environment inside the second compartment 78, then to the second process material in the environment inside the third compartment 80, and finally to the purge gas comprising the environment inside the fourth compartment 82. Each of the recesses 52 has a desired dwell time in each of the respective compartments 76, 78, 80, 82, as mandated by the characteristics of the thin film to be deposited on each of the substrates 15, sufficient to form the thin film.

The second wall 34 includes a bottom purge opening 130 for introducing a purge gas from a purge gas system 131 into the process chamber 16 beneath or under the substrate support 48. The presence of purge gas under the substrate support 48 may serve to reduce the transfer of the first and second process materials outside of their respective compartments 76, 80.

Figure 2:
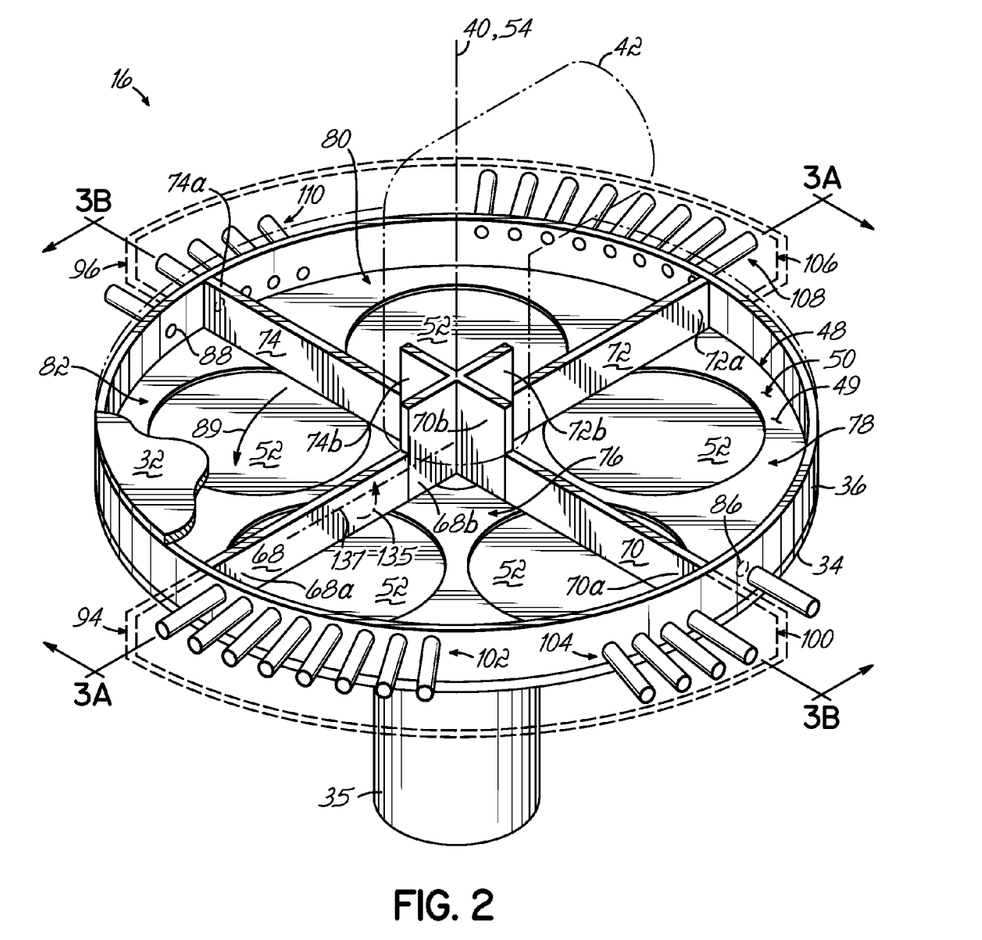
FIG. 2 is a perspective view of the process chamber of FIG. 1 with a top wall omitted for clarity.
Figure 2A:
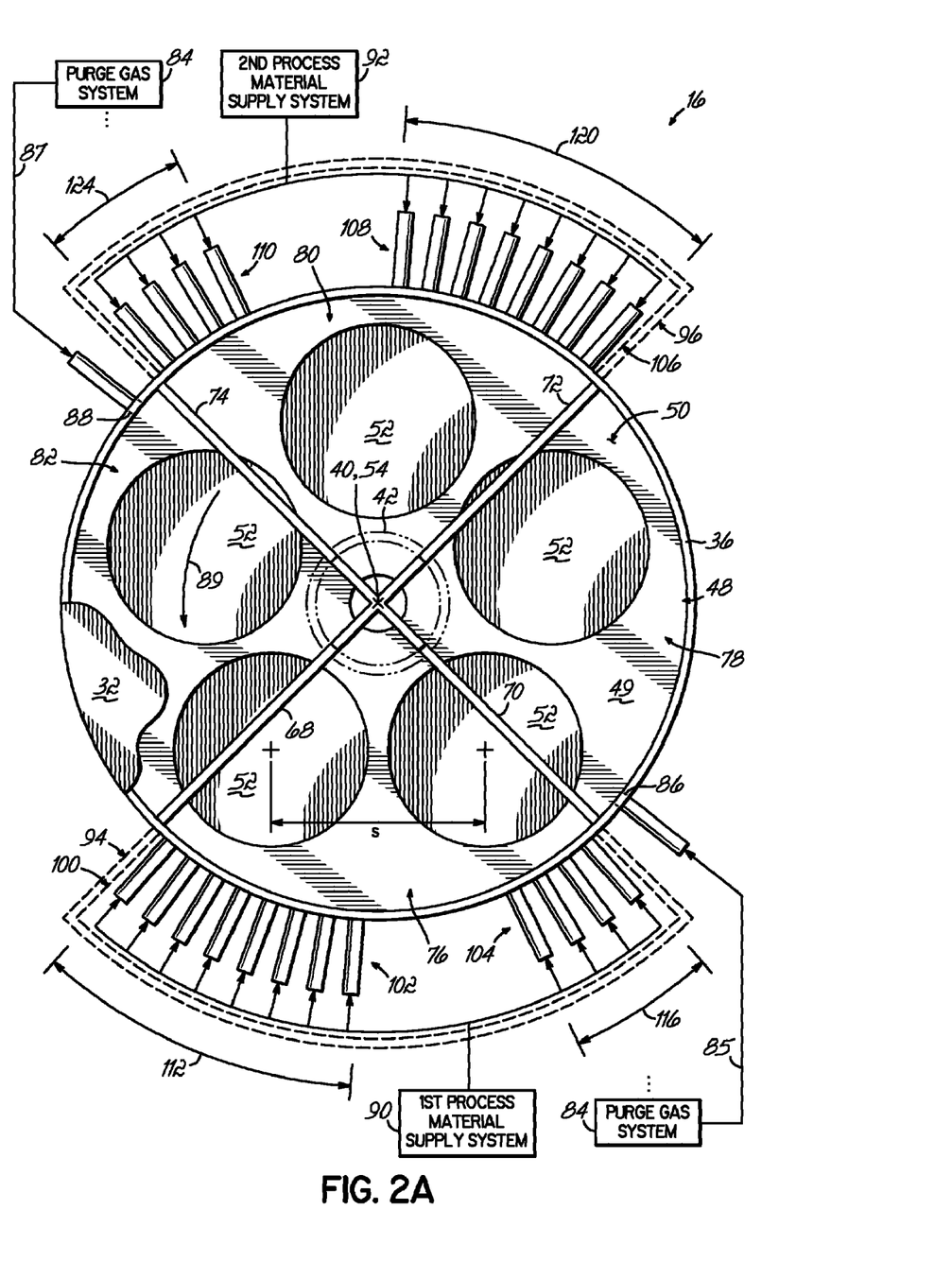
FIG. 2A is a top view of the process chamber of FIG. 2.

In use and with reference to FIGS. 1, 2, 2A, 3A, and 3B, the process chamber 16 of the deposition system 10 is used for depositing a layer on each of the substrates 15 received in the recesses 52 on the platter 50 and arranged with a spaced circumferential relationship about the axis of rotation 54. The substrates 15 are continuously rotated in a closed path about the axis of rotation 54, as indicated by the single-headed arrow 89 (FIGS. 1, 2, 2A). The angular velocity may be, for example, about 240 revolutions per minute. A first process material is injected in a radial direction relative to the axis of rotation 54 and into the first compartment 76, which bounds the first angular arc 112 about the axis of rotation 54. Each of the continuously rotating substrates 15 is exposed to the first process material within the first compartment 76 during each complete rotation of the platter 50. The first process material is injected in a first stream at the first height, $h_1$, above the substrates 15 over the first angular arc 112 within the first compartment 76 and in a second stream at the second height, $h_2$, above the substrates 15 over the second angular arc 116 within the first compartment 76.

Before and after the exposure to the first process material, each of the continuously rotating substrates is exposed to an inert atmosphere within the second and fourth compartments 78, 82, which respectively bound the second and fourth angular arcs 116, 126 about the axis of rotation 54 during each complete rotation. The second process material is injected in the radial direction relative to the axis of rotation 54 and into the third compartment 80, which is isolated from the first compartment 76 by the second and fourth compartments 78, 82. The layer is incrementally formed as a series of discrete thin film lamina on each of the continuously rotating substrates 15 by chemical reactions of the first and second process materials. By way of example only and not limitation, the vacuum pressures inside the first and second compartments 76, 80 may be on the order of 10 Torr and the substrates 15 may be heated to a process temperature of about 400° C. while exposed to the first and second process materials.

The deposition process form is a conventional deposition technique in which deposition of each atomic layer of the thin film, or a fraction thereof, on the substrates 15 is controlled by alternating and sequential introduction of appropriate gas phase precursors that react in a self-limiting manner to incrementally form or build the thin film. Within the first compartment 76, molecules of the first process material bond (chemically, by absorption, by adsorption, etc.) to the top surface of each of the substrates 15 to form a monolayer or a fraction of a monolayer of the first process material. Within the third compartment 80, the second process material reacts with the molecules of the first process material on each successive substrate 15. As the substrates 15 are rotated through the first and third compartments 76, 80, these steps are repeated with sequential subsequent exposures to the first and second process materials. The environments of first and second process materials in the first and third compartments 76, 80, respectively, are isolated from each other by the chemically non-reactive, purge gas environments inside the second and fourth compartments 78, 82. The environments inside the first and third compartments 76, 80 are not altered to achieve the successive exposure to the first and second materials.

The substrates 15 may be heated to a process temperature to promote the deposition process. In comparison with predominantly thermally driven CVD processes, ALD is predominantly chemically driven. Accordingly, ALD may be conducted at significantly lower substrate temperatures than CVD.

The rotation of the substrates 15 may be regulated such that different substrates 15 are exposed to the first process material when the injection of the first process material is initiated and the injection of the first process material is discontinued. This type of regulation may be effective for controlling the uniformity of deposited layers that are relatively thin. The compartments 76, 78, 80, 82 may be evacuated through the fore line 42 communicating with the first compartment from a location above the substrates. The substrates 15 may be rotated about the axis of rotation 54 with a constant angular velocity.

The invention contemplates that the partitions 68, 70, 72, 74 compartmentalizing the processing space 38 may be adjusted such that the compartments 76, 78, 80, 82 are merged together into a single compartment for depositing layers by CVD processes in the process chamber 16. Specifically, the partitions 68, 70, 72, 74 may be configured to be pivoted, as indicated by reference numeral 135, by a positioning device (not shown) about a radial axis 137 extending generally from the axis of rotation 54 from a vertical orientation (as shown in FIGS. 1, 2, 2A, 3A, 3B) to a substantially horizontal orientation. Gas injected through the material injectors 100, 106 may be used to deliver the first and second process materials for the CVD deposition process. The CVD deposition process may be conducted with the substrate support 48 rotating or, alternatively, with the substrate support 48 stationary.

Figure 4:
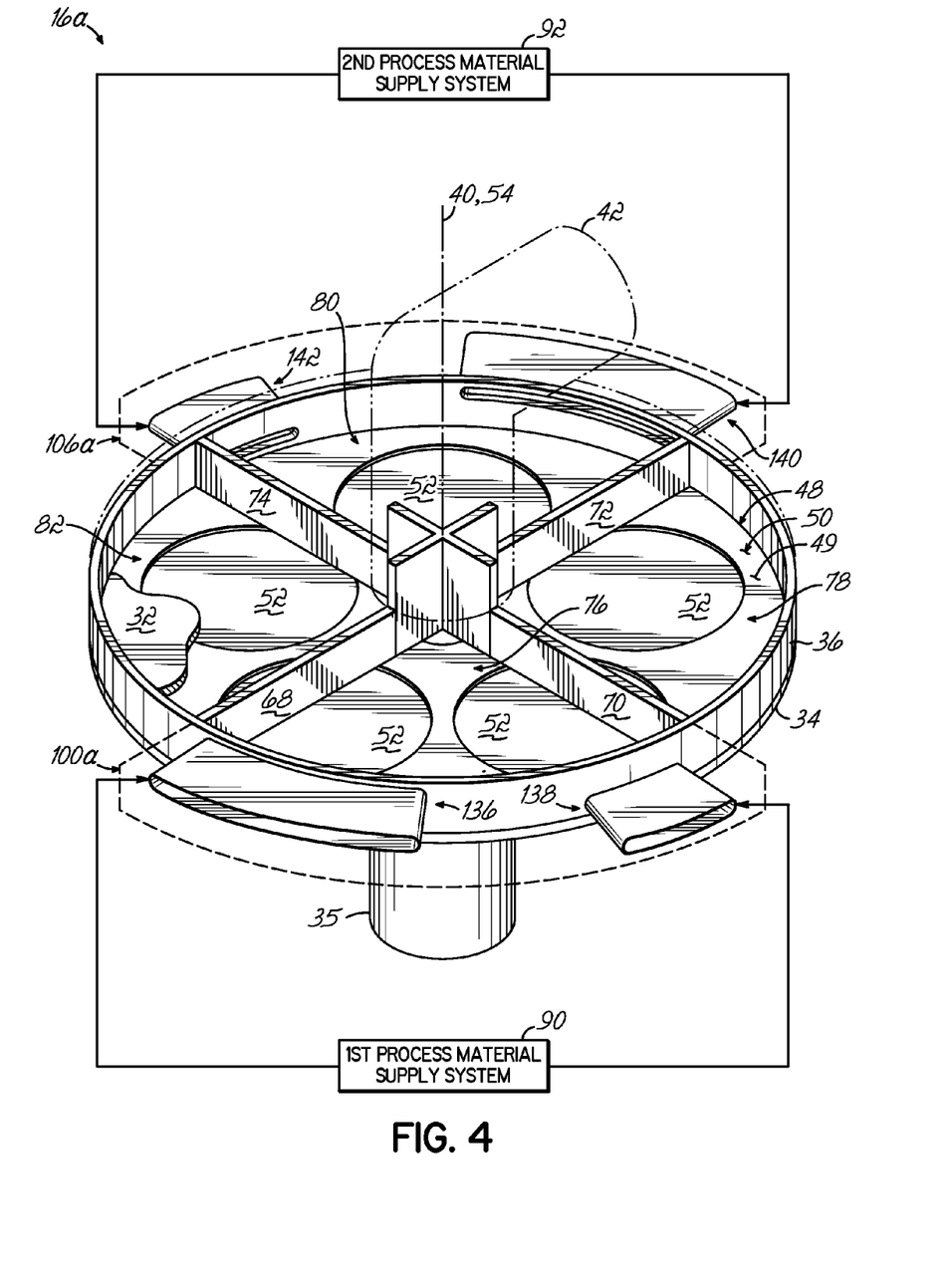
FIG. 4 is a perspective view similar to FIG. 2 of a process chamber in accordance with an alternative embodiment of the invention.

With reference to FIG. 4 in which like reference numerals refer to like features in FIGS. 1, 2, 2A, 3A, and 3B and in accordance with an alternative embodiment of the invention, a process chamber 16a includes a material injector 100a that substitutes slotted injection ports 136, 138 for the respective sets of injection ports 102, 104 (FIGS. 2, 2A, 3A, 3B), and a material injector 106a that substitutes slotted injection ports 140, 142 for the respective sets of injection ports 108, 110 (FIGS. 2, 2A, 3A, 3B). Similar to injection ports 102, injection slot 136 is spatially positioned proximate to the first partition 68 and is aligned along the first angular arc 112. Similar to injection ports 104, injection slot 138 is spatially positioned proximate to the second partition 70 and is aligned along the second angular arc 116. Similar to injection ports 108, injection slot 140 is spatially positioned proximate to the third partition 72 and is aligned along the third angular arc 120. Similar to injection ports 110, injection slot 142 is spatially positioned proximate to the fourth partition 74 and is disposed along the fourth angular arc 124. The properties of the injections slots 136, 138, 140, 142 are substantially similar to the properties of the injection ports 102, 104, 108, 110, as described hereinabove.

Figure 5:
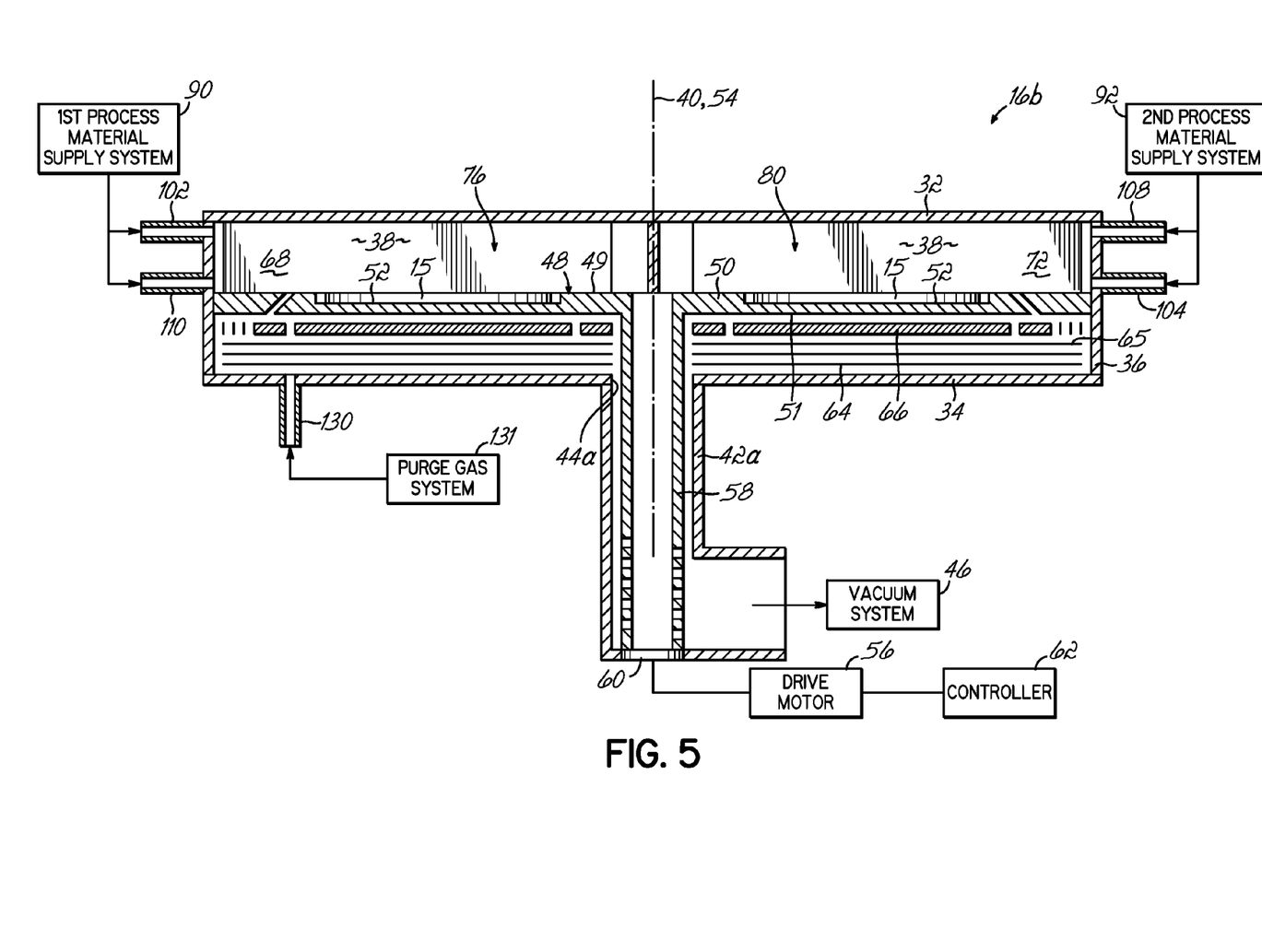
FIG. 5 is a schematic cross-sectional view similar to FIG. 3A of a process chamber in accordance with an alternative embodiment of the invention.

With reference to FIG. 5 in which like reference numerals refer to like features in FIGS. 1, 2, 2A, 3A, 3B, and 4 and in accordance with an alternative embodiment of the invention, a process chamber 16b includes a fore line 42a, which has the form of a duct or tubular conduit bent at a right angle, coupled with a port 44a extending through the second wall 34 of the process chamber 16b. In this bottom pumped configuration, excess process materials and deposition by-products are removed from the process chamber 16b through port 44a. In this embodiment, the first and second angular arcs 112, 116 overlap such that at least one of the injection ports 102 overlaps spatially with at least one of the injection ports 104 but in different planes 114, 118. Similarly, in this embodiment, the third and fourth angular arcs 120, 124 overlap such that at least one of the injection ports 108 overlaps spatially with at least one of the injection ports 110 but in different planes 122, 126.

Figure 6:
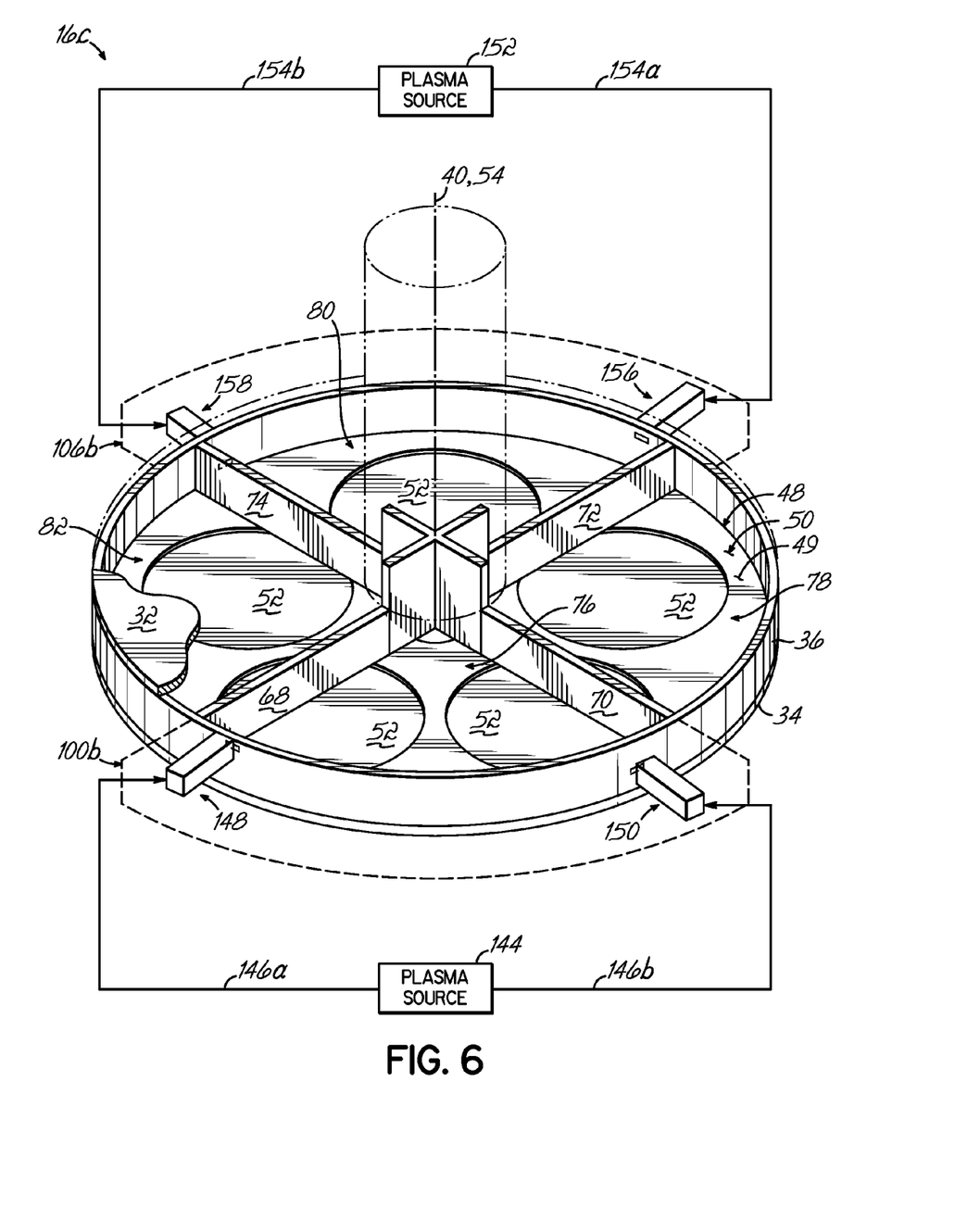
FIG. 6 is a perspective view similar to FIG. 2 of a process chamber in accordance with another alternative embodiment of the invention.

With reference to FIG. 6 in which like reference numerals refer to like features in FIGS. 1, 2, 2A, 3A, 3B, 4 and 5 and in accordance with an alternative embodiment of the invention, a process chamber 16c includes a material injector 100b that includes a plasma source 144 that supplies the first process material to compartment 76 in the form of a plasma product comprising ions, radicals, or a combination thereof. Waveguides 146a,b couple the plasma source 144 with injection ports 148, 150 in the peripheral sidewall 36 of the process chamber 16c. Injection port 148 is located proximate to the first partition 68 and the second injection port 150 is located proximate to the second partition 70. Process chamber 16c further includes a material injector 106b that includes a plasma source 152 that supplies the second process material to compartment 80 in the form of a plasma product comprising ions, radicals, or a combination thereof. Waveguides 154a,b couple the plasma source 152 with injection ports 156, 158 in the peripheral sidewall 36 of the process chamber 16c. Injection port 156 is located proximate the third partition 72 and injection port 158 is located proximate the fourth partition 74.

The process chamber 16c may be used for plasma-enhanced atomic layer deposition of thin films on the substrates 15. The invention contemplates that, although process chamber 16c includes multiple plasma sources 144, 152, either the first process material or the second process material may be supplied to compartments 76, 80 using injection ports 102, 104, 108, 110 (FIGS. 1, 2, 2A, 3A, 3B) or slotted injection ports 136, 138, 140, 142 (FIG. 4). The location of the injection ports 148, 150 about the sidewall 36 may be used to modulate the uniformity of the deposited film on substrates 15.

Figure 7:
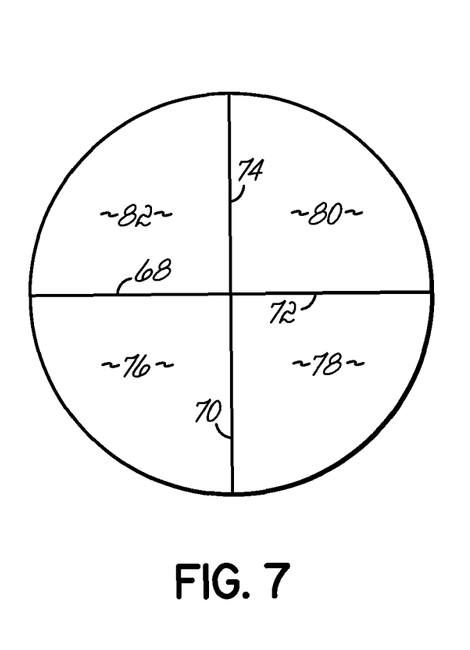
FIGS. 7-9 are diagrammatic views showing arrangements of partitions for compartmentalizing a processing space inside the process chamber of FIGS. 1, 2, 2A, 3A, and 3B in accordance with embodiments of the invention.
Figure 8:
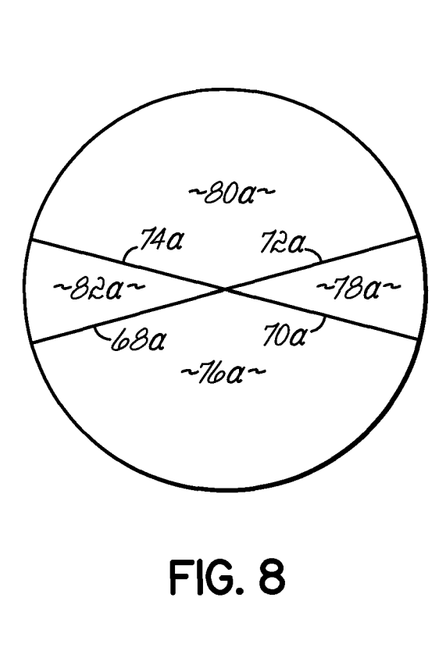
Figure 9:
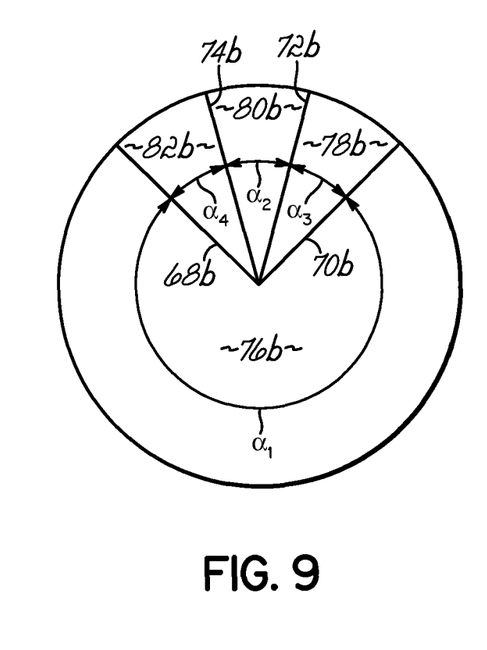

With reference to FIGS. 7-9, the angular orientation of the partitions 68, 70, 72, 74 may be adjusted to change the arc lengths of angular segments occupied by the compartments 76, 78, 80, 82.

With specific reference to FIG. 7, the partitions 68, 70, 72, 74 are arranged relative to each other with included right angles that are congruent. As the platter 50 of substrate support 48 (FIG. 2) is rotated with a constant angular velocity, the substrates 15 carried by the platter 50 are exposed sequentially to each compartment 76, 80 for about approximately equivalent dwell times to form repeating layers of the first and second process materials on the top surface of each of the substrates 15. This arrangement for partitions 68, 70, 72, 74 is representative of process chambers 16, 16a, 16b, 16c depicted in FIGS. 1-6.

With specific reference to FIG. 8, the processing space 38 is divided into compartments 76a, 78a, 80a, 82a, which are similar to compartments 76, 78, 80, 82, by partitions 68a, 70a, 72a, 74a, which are similar to partitions 68, 70, 72, 74. The first and second partitions 68a, 70a are separated by an obtuse included angle and bound compartment 76a. The third and fourth partitions 72a, 74a are separated by an obtuse included angle and bound compartment 80a. The obtuse included angle between the third and fourth partitions 72a, 74a is congruent with the obtuse included angle between the first and second partitions 68a, 70a because these obtuse included angles represent vertical angles. The obtuse included angles between the first and second partitions 68a, 70a and between the third and fourth partitions 72a, 74a necessarily create equivalent acute angles between the second and third partitions 70a, 72a and between the first and fourth partitions 68a, 74a. The acute angle between the second and third partitions 70a, 72a, which bound compartment 78a, is congruent with the acute angle between the first and fourth partitions 68a, 74a, which bound compartment 82a. These congruent acute included angles represent vertical angles. The acute included angle between the second and third partitions 70a, 72a and the obtuse included angle either between the third and fourth partitions 72a, 74a or between the first and second partitions 68a, 70a are supplemental angles. The acute included angle between the first and fourth partitions 68a, 74a and the obtuse included angle either between the third and fourth partitions 72a, 74a or between the first and second partitions 68a, 70a are also supplemental angles.

As the platter 50 of substrate support 48 (FIG. 2) is rotated with a constant angular velocity, the substrates 15 carried by the platter 50 are exposed sequentially to the first and second process materials with larger dwell times than for the arrangement shown in FIG. 7, assuming equal angular velocities. The dwell times in the first and third compartments 76a, 80a are approximately equal. A person having ordinary skill in the art would appreciate that the angles between the partitions 68a, 70a, 72a, 74a and angular velocity can be adjusted to adjust the dwell time of the substrates 15 in each of the compartments 76a, 80a. By lengthening the dwell times, the increase exposure to the first and second process materials may operate to increase the growth rate for the thin film.

With reference to FIG. 9, the processing space 38 is divided into compartments 76b, 78b, 80b, 82b, which are similar to compartments 76, 78, 80, 82, by partitions 68b, 70b, 72b, 74b, which are similar to partitions 68, 70, 72, 74. The included angle, $\alpha_1$, between the first and second partitions 68b, 70b is greater than the included angle, $\alpha_2$, between the third and fourth partitions 72b, 74b. Additionally, the included angle, $\alpha_3$, between the second and third partitions 70b, 72b is approximately equal to the included angle, $\alpha_4$, between the first and fourth partitions 68b, 74b. As the platter 50 of substrate support 48 (FIG. 2) is rotated, the substrates 15 carried by the platter 50 are sequentially exposed to the first process material in the first compartment 76b for a first dwell time, to purge gas in the second compartment 78b for a second dwell time wherein the second dwell time is shorter than the first dwell time, to the second process material in the third compartment 80b for a third dwell time wherein the third dwell time is shorter than the first dwell time, and again to purge gas in the fourth compartment 82b for a dwell time equivalent to the second dwell time, thereby forming repeating layers of the first and second process materials on the top surface of each of the substrates 15. The individual dwell times are independent of the angular velocity if the platter 50 of substrate support 48 (FIG. 2) is rotated at a constant angular velocity.

Although the partitions 68b, 70b, 72b, 74b are arranged such that $\alpha_1$ is about 270° and $\alpha_2$ is about 30°, a person having ordinary skill in the art would appreciate that the partitions 68b, 70b, 72b, 74b can be configured to provide for any desired dwell times within the four compartments 76b, 78b, 80b, 82b. The dwell times may be adjusted to, for example, compensate for first and second process materials having different reaction rates. For example, the dwell time for exposure to the first process material in the first compartment 76b is significantly greater than the dwell time for exposure to the second process material in the third compartment 80b, which would maximize the exposure to the first process material to compensate for a second process material that is fast acting.

While the invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A deposition system for processing a plurality of substrates, the deposition system comprising:
   a process chamber including a first wall, a second wall spaced vertically from said first wall and oriented generally parallel with said first wall, and a peripheral sidewall extending from said first wall to said second walls to define a processing space;
   a substrate support disposed between said first and second walls and radially inside said peripheral sidewall, the substrate support configured to rotate the substrates relative to said peripheral sidewall about an axis of rotation, and said substrate support having a surface configured to hold the substrates;
   a plurality of partitions each extending radially from said axis of rotation toward said peripheral sidewall, said partitions dividing said processing space into a first compartment and a second compartment, and said second compartment configured to contain an inert atmosphere; and
   a first injector communicating through said peripheral sidewall with said first compartment, said first injector including a first plurality of injection ports configured to inject a first process material through said peripheral sidewall into said first compartment and a second plurality of injection ports configured to inject the first process material through said peripheral sidewall into said first compartment, said first plurality of injection ports arranged in a first plane disposed at a first height between said first wall and said substrate support, and said second plurality of injection ports arranged in a second plane at a second height above said surface of said substrate support that differs from the first height of the first plane,
   wherein said substrate support moves each of the substrates for sequential exposure of a top surface of each of the substrates to the first process material in said first compartment and the inert atmosphere in said second compartment.

2. The deposition system of claim 1 wherein said partitions further divide said processing space to include a third compartment configured to contain an inert atmosphere, said first compartment being juxtaposed between the inert atmosphere in said second compartment and the inert atmosphere in said third compartment.

3. The deposition system of claim 2 wherein said substrate support is configured to rotate about said axis of rotation such that each of the substrates is sequentially exposed to the inert atmosphere in said second compartment, the first process material in said first compartment, and the inert atmosphere in said third compartment.

4. The deposition system of claim 1 wherein said partitions further divide said processing space to include a third compartment arranged such that said second compartment is juxtaposed between said first and third compartments, and further comprising:
   a second injector communicating through said peripheral sidewall with said third compartment, said second injector configured to introduce a second process material into said third compartment.

5. The deposition system of claim 4 wherein the substrate support is configured to rotate about said axis of rotation such that each of the substrates is sequentially exposed to the first process material in said first compartment, the inert atmosphere in said second compartment, and the second process material in said third compartment.

6. The deposition system of claim 4 wherein said partitions intersect at said axis of rotation, said first compartment is bounded about said axis of rotation by adjacent portions separated by a first included angle, and said third compartment is bounded about said axis of rotation by adjacent partitions separated by a second included angle different than said first included angle.

7. The deposition system of claim 4 wherein said partitions further divide said processing space to define a fourth compartment arranged such that said second compartment is juxtaposed between said first and third compartments, said fourth compartment being diametrically opposite to said second compartment relative to said axis of rotation, and said fourth compartment configured to contain an inert atmosphere.

8. The deposition system of claim 1 wherein said surface of said substrate support includes a plurality of recesses each configured to hold at least one of the substrates.

9. The deposition system of claim 8 further comprising:
   a drive motor outside of said process chamber;
   a drive shaft mechanically coupled with said platter and extending along said axis of rotation; and
   a rotary feedthrough extending through said second wall and coupling said drive shaft with said drive motor, said rotary feedthrough configured to transmit rotary motion from said drive motor to said drive shaft for rotating said platter about said axis of rotation.

10. The deposition system of claim 9 further comprising:
    a controller electrically coupled with said drive motor, said controller operating said drive motor to rotate said platter about said axis of rotation.

11. The deposition system of claim 8 wherein said recesses are distributed on said surface about a uniform radius centered on said axis of rotation, adjacent pairs of said recesses having approximately equiangular circumferential spacings about said axis of rotation.

12. The deposition system of claim 1 wherein said peripheral sidewall extends circumferentially about an azimuthal axis that is substantially coaxial with said axis of rotation.

13. The deposition system of claim 1 said first injector is configured to inject the first process material into said first compartment generally toward said axis of rotation.

14. The deposition system of claim 1 further comprising:
    a source of the first process material coupled by said first injector with said first compartment.

15. The deposition system of claim 1 wherein the first process material is a plasma product comprising ions, radicals, or a combination thereof, and further comprising:
    a first source of the plasma product coupled by said first injector with said first compartment.

16. The deposition system of claim 1 wherein said first injector is positioned to inject the first process material at a location between said first wall and the substrate support, and further comprising:
    a vacuum port communicating through said first wall with said first and second compartments; and
    a vacuum line coupled with said vacuum port.

17. The deposition system of claim 16 wherein said partitions project through said vacuum port into said vacuum line.

18. The deposition system of claim 1 wherein said first injector is positioned to inject the first process material at a location between said first wall and said substrate support, and further comprising:
   a vacuum port communicating through said second wall with said first and second compartments.

19. The deposition system of claim 1 wherein said partitions comprise a first partition and a second partition cooperating to bound said first compartment, and said first plurality of said injection ports is arranged along a first angular arc within said first compartment proximate to said first partition, and said second plurality of said injection ports is arranged along a second angular arc within said first compartment proximate to said second partition.

20. The deposition system of claim 1 wherein said process chamber and said partitions are stationary.

21. The deposition system of claim 1 wherein said partitions are configured to be moved relative to said peripheral sidewall so that said first compartment is continuous with said second compartment.

22. A deposition system for processing a plurality of substrates, the deposition system comprising:
   a process chamber including a first wall, a second wall spaced vertically from said first wall and oriented generally parallel with said first wall, and a peripheral sidewall extending from said first wall to said second walls to define a processing space;
   a substrate support disposed between said first and second walls and radially inside said peripheral sidewall, the substrate support configured to rotate the substrates relative to said peripheral sidewall about an axis of rotation, and said substrate support having a surface configured to hold the substrates;
   a plurality of partitions each extending radially from said axis of rotation toward said peripheral sidewall, said partitions dividing said processing space into a first compartment and a second compartment, and said second compartment configured to contain an inert atmosphere;
   a first injection slot communicating through said peripheral sidewall with said first compartment and configured to inject a first process material through said peripheral sidewall into said first compartment, said first injection slot extending circumferentially about said peripheral sidewall and in a first plane at a first height above said substrate support; and
   a second injection slot extending circumferentially about said peripheral sidewall and in a second plane at a second height above said surface of said substrate support that differs from the first height of the first plane, said second injection slot configured to inject the first process material through said peripheral sidewall into said first compartment,
   wherein said substrate support moves each of the substrates for sequential exposure of a top surface of each of the substrates to the first process material in said first compartment and the inert atmosphere in said second compartment.

23. The deposition system of claim 22 wherein said partitions comprise a first partition and a second partition cooperating to bound said first compartment, and said first injection slot extends along a first angular arc within said first compartment proximate to said first partition, and said second injection slot extends along a second angular arc within said first compartment proximate to said second partition.

* * * * *

UNITED STATES PATENT AND TRADEMARK OFFICE
CERTIFICATE OF CORRECTION

PATENT NO. : 8,043,432 B2  
APPLICATION NO. : 11/673852  
DATED : October 25, 2011  
INVENTOR(S) : Anthony Dip Page 1 of 1

It is certified that error appears in the above-identified patent and that said Letters Patent is hereby corrected as shown below:

IN THE SPECIFICATIONS:

Col. 1, line 12, "materials increase" should read --materials increases--.

Col. 7, line 15, "for example, comprises" should read --for example, comprise--.

Col. 7, line 56, "hi" should read --$h_1$--.

Col. 12, line 25, "the increase" should read --the increased--.

IN THE CLAIMS:

Col. 13, line 16, Claim 1, "second walls" should read --second wall--.

Col. 14, line 48, Claim 13, "claim 1 said" should read --claim 1 wherein said--.

Col. 15, line 26, Claim 22, "second walls" should read --second wall--.

Signed and Sealed this  
Seventeenth Day of January, 2012

David J. Kappos  
*Director of the United States Patent and Trademark Office*